United States Patent
Oka et al.

(10) Patent No.: US 10,794,967 B2
(45) Date of Patent: Oct. 6, 2020

(54) SENSOR INTERMEDIATE PART, SENSOR AND SENSOR MANUFACTURING METHOD

(71) Applicant: TDK Corporation, Tokyo (JP)

(72) Inventors: Teiichiro Oka, Tokyo (JP); Hiroyuki Hirano, Tokyo (JP); Mikio Sumiyoshi, Tokyo (JP); Makoto Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 116 days.

(21) Appl. No.: 16/221,725

(22) Filed: Dec. 17, 2018

(65) Prior Publication Data

US 2019/0187224 A1 Jun. 20, 2019

(30) Foreign Application Priority Data

Dec. 18, 2017 (JP) .................. 2017-241484

(51) Int. Cl.
*G01R 33/07* (2006.01)
*G01R 19/00* (2006.01)
(Continued)

(52) U.S. Cl.
CPC .............. *G01R 33/07* (2013.01); *G01R 3/00* (2013.01); *G01R 15/207* (2013.01);
(Continued)

(58) Field of Classification Search
CPC ............ G01R 33/00; G01R 33/0017; G01R 33/0023; G01R 33/0035; G01R 33/0052; G01R 33/02; G01R 33/06; G01R 33/07; G01R 33/072; G01R 33/09; G01R 33/091; G01R 35/00; G01R 35/005; G01R 19/00; G01R 19/0084; G01R 19/0092; G01R 15/00; G01R 15/14; G01R 15/20; G01R 15/205; G01R 15/207; G01R 3/00; G01R 31/00; G01R 31/3191; H01L 43/00; H01L 43/06
(Continued)

(56) References Cited

U.S. PATENT DOCUMENTS 4,383,444 A * 5/1983 Beaman ................ G01F 23/266
                                                        73/1.73
5,894,241 A * 4/1999 Rees ................ H03K 19/01714
                                                        326/27
(Continued)

FOREIGN PATENT DOCUMENTS

JP        2014-085240 A      12/2014

*Primary Examiner* — Hoai-An D. Nguyen
(74) *Attorney, Agent, or Firm* — Posz Law Group, PLC

(57) ABSTRACT

A sensor intermediate part is provided with a physical quantity detection element that has a power source terminal, a ground terminal and an output terminal that outputs a desired output signal, where the physical quantity detection element is capable of adjusting properties of the output signal; a high-capacitance capacitor, which has at least a first terminal and a second terminal, and a jumper wire, one end of which is conducted to either the power source terminal or the second terminal and the other end of which is not conducted. The first terminal is conducted to the ground terminal, and the power source terminal and the second terminal are configured to be electrically connectable by the jumper wire.

11 Claims, 7 Drawing Sheets

(51) Int. Cl.
  *H01L 43/06*  (2006.01)
  *G01R 15/20*  (2006.01)
  *G01R 3/00*   (2006.01)
  *G01R 35/00*  (2006.01)
(52) U.S. Cl.
  CPC .......... *G01R 19/0092* (2013.01); *H01L 43/06* (2013.01); *G01R 35/005* (2013.01)
(58) Field of Classification Search
  USPC .......... 324/200, 202, 207.2, 207.11, 207.13, 324/76.11, 130, 600, 601, 750.02; 702/85
  See application file for complete search history.

(56) References Cited

U.S. PATENT DOCUMENTS

| | | | | |
|---|---|---|---|---|
| 2003/0057968 | A1* | 3/2003 | Wang | G01R 27/2605 324/690 |
| 2019/0288697 | A1* | 9/2019 | Ryu | H03L 7/085 |

* cited by examiner

SENSOR INTERMEDIATE PART, SENSOR AND SENSOR MANUFACTURING METHOD

CROSS REFERENCE TO RELATED APPLICATIONS

The present application is based on Japanese Patent Application No. 2017-241484 filed on Dec. 18, 2017, the disclosure of which is incorporated herein by reference.

FIELD OF THE INVENTION

The present invention relates to a sensor intermediate part, a sensor and a sensor manufacturing method.

BACKGROUND OF THE INVENTION

Conventionally, for example, as an electric current sensor used for controlling the input and output current of a battery such as hybrid electric vehicle (HEV) or an electric vehicle (EV) or the like, an electric current sensor that uses a magnetic detection element such as a Hall IC to measure input and output electric current flowing in a conductor such as a bus bar or the like connected to a battery has been known. In addition, as a Hall IC used for an electric current sensor, a programmable Hall IC or the like whose properties such as magnetic sensitivity (output voltage) or zero magnetic field voltage or the like (below, these are at times collectively referred to as "output signals") can be adjusted has been known. EEPROM (Electrically Erasable Programmable Read-Only Memory) is incorporated in the programmable Hall ICs, and parameters that determine the properties of the output signals are stored in this EEPROM. Adjustment of the properties of the output signals is performed by newly inputting (writing) the adjustment parameter into the EEPROM, or rewriting the parameter stored in advance in the EEPROM.

PRIOR ART

Patent Literature

[PATENT LITERATURE 1] JP Laid-Open Patent Application No. 2014-85240

SUMMARY OF THE INVENTION

Problem to be Solved by the Invention

In an electric current sensor that uses a magnetic detection element such as a Hall IC or the like, it is difficult to avoid the occurrence of variance in the magnetic permeability of the magnetic core or the position and size of the magnetic circuit (for example, the magnetic core or the like). Consequently, even if the attempt is made to assemble an electric current sensor using magnetic detection elements such as Hall ICs or the like in which the properties of the output signals have been adjusted in advance, in many cases the properties of the output signals from the magnetic detection element in the electric current sensor after assembly are not within the desired error range. Hence, in order to obtain the desired output signals even after the electric current sensor is assembled, it is desirable to adjust the properties of the output signals in the intermediate parts (at times also referred to as "semi-finished products") in which the various parts configuring the electric current sensor are assembled to a certain extent.

However, to cause stable operation in the various kinds of sensors even when the power source voltage changes intermittently due to outside factors, a high-capacitance capacitor may be provided between the power source terminal and the ground terminal. On the other hand, when adjusting the properties of the output signals of the electric current sensor that uses Hall ICs, the write signal (programming signal) and the synchronization signal at the time of programming or the like may be input from the power source terminal of the Hall ICs as the above-described adjustment parameters. In such cases, when the aforementioned write signals or synchronization signals or the like are input from the power source terminal while the capacitor conducts with the power source terminal, the signal waveform thereof is deformed by the effects of the capacitor, and it may be difficult to adjust the properties of the output signals.

Hence, it is an object of the present invention to provide a sensor intermediate part in which the properties of the output signals can be stably adjusted without being affected by the capacitor, a sensor capable of outputting signals with stable properties, and a method of manufacturing such.

Means for Solving the Problem

In order to resolve the above problems, the present invention provides a sensor intermediate part that includes a physical quantity detection element that has a power source terminal, a ground terminal and an output terminal, which outputs a desired output signal, where the physical quantity detection element is capable of adjusting the properties of the output signal; a high-capacitance capacitor, which has at least a first terminal and a second terminal; and a jumper wire, one end of which is conducted to either the power source terminal or the second terminal and the other end of which is not conducted. The first terminal is conducted to the ground terminal, and the power source terminal and the second terminal are configured to be electrically connectable by the jumper wire.

Preferably, the above-described sensor intermediate part further includes a circuit board having a first surface and a second surface, which is opposite to the first surface. The physical quantity detection element and the capacitor are arranged on the first surface of the circuit board. A first through hole and a second through hole, which penetrate in the thickness direction of the circuit board, are formed with a prescribed spacing in the circuit board. A first pad, which can be conducted to one of the power source terminal and the second terminal, is arranged at the periphery of the opening of the first through hole on the first surface, and a second pad, which can be conducted to the other of the power source terminal and the second terminal, is arranged at the periphery of the opening of the second through hole on the second surface. One end of the jumper wire, which is roughly U-shaped, is inserted into the first through hole, and the one end of the jumper wire is electrically connected to the first pad on the first surface. The other end of the jumper wire is inserted into the second though hole, and the other end of the jumper wire is not electrically connected to the second pad on the second surface.

Preferably, in the above-described sensor intermediate part, the second pad is provided at a position separated in the radial direction from the opening periphery of the second through hole on the second surface. Preferably, the above-described sensor intermediate part further includes a housing that holds the circuit board. The housing includes a first housing and a second housing that covers an opening of the first housing. The second through hole is formed in the circuit board such that at least the second pad exists at a position close to the opening of the first housing or protruding from the opening when the circuit board is held in the first housing. The above-described capacitor preferably has a capacitance of 1 µF or more.

In addition, the present invention provides a sensor in which the power source terminal and the second terminal of the above-described sensor intermediate part are electrically connected by the jumper wire.

In addition, the present invention provides sensor manufacturing method that includes: a preparation step in which a circuit board is prepared on which are mounted a physical quantity detection element, which has a power source terminal, a ground terminal and an output terminal, which outputs a desired output signal. The properties of the output signal are adjustable. A capacitor, which has at least a first terminal and a second terminal is also mounted on the circuit board. One end of the jumper wire is conducted to one of the power source terminal and the second terminal and the other end of the jumper wire is not conducted to the other of the power source terminal and the second terminal, and the ground terminal and the first terminal are conducted. Properties of the output signal are adjusted in an adjustment step. After the properties of the output signal are adjusted, the other of the power source terminal and the second terminal are conducted to the other end of the jumper wire in a connection step, so the second terminal and the power source terminal are electrically connected via the jumper wire. Magnetic field strength, magnetic flux density, acceleration, angular acceleration, light strength (number of photons, optical power, incident light strength converted from the electric current value of electric current generated by the photoelectric effect, or the like), ultrasonic waves, pressure (value) or the like, for example, are included in the physical quantities that can be detected by the physical quantity detection element.

In the above-described sensor manufacturing method, preferably the circuit board has a first surface and a second surface, which is opposite the first surface. A first through hole and a second through hole, which penetrate in the thickness direction, are formed with a prescribed spacing in the circuit board. A first pad conducting to one of the power source terminal and the second terminal is provided at the periphery of the opening of the first through hole on the first surface, and a second pad conducting to the other is provided at the periphery of the opening of the second through hole on the second surface. One end of the jumper wire, which is roughly U-shaped, is inserted into the first through hole. The first pad and the one end side of the jumper wire are electrically connected. The other end of the jumper wire is inserted into the second through hole. The second pad and the other end side of the jumper wire are not electrically connected.

In addition, in the above-described sensor manufacturing method, the second pad and the other end side of the jumper wire are preferably electrically connected in the connection step. The second pad is preferably provided at a position separated in the radial direction from the opening periphery of the second through hole on the second surface.

In addition, the present invention provides a sensor intermediate part includes a physical quantity detection element that has a power source terminal, a ground terminal and an output terminal, which outputs a desired output signal, where the physical quantity detection element is capable of adjusting properties of the output signal; a high-capacitance capacitor, which has at least a first terminal and a second terminal; and a jumper wire, one end of which is conducted to either the power source terminal or the second terminal and the other end of which is not conducted. The first terminal is conducted to the power source terminal. The ground terminal and the second terminal are configured to be electrically connectable via the jumper wire.

Effects of the Invention

With the present invention, it is possible to provide a sensor intermediate part in which the properties of the output signals can be stably adjusted without being affected by the capacitor, a sensor capable of outputting signals with stable properties, and a method of manufacturing such.

MODE FOR CARRYING OUT THE INVENTION

Figure 1:
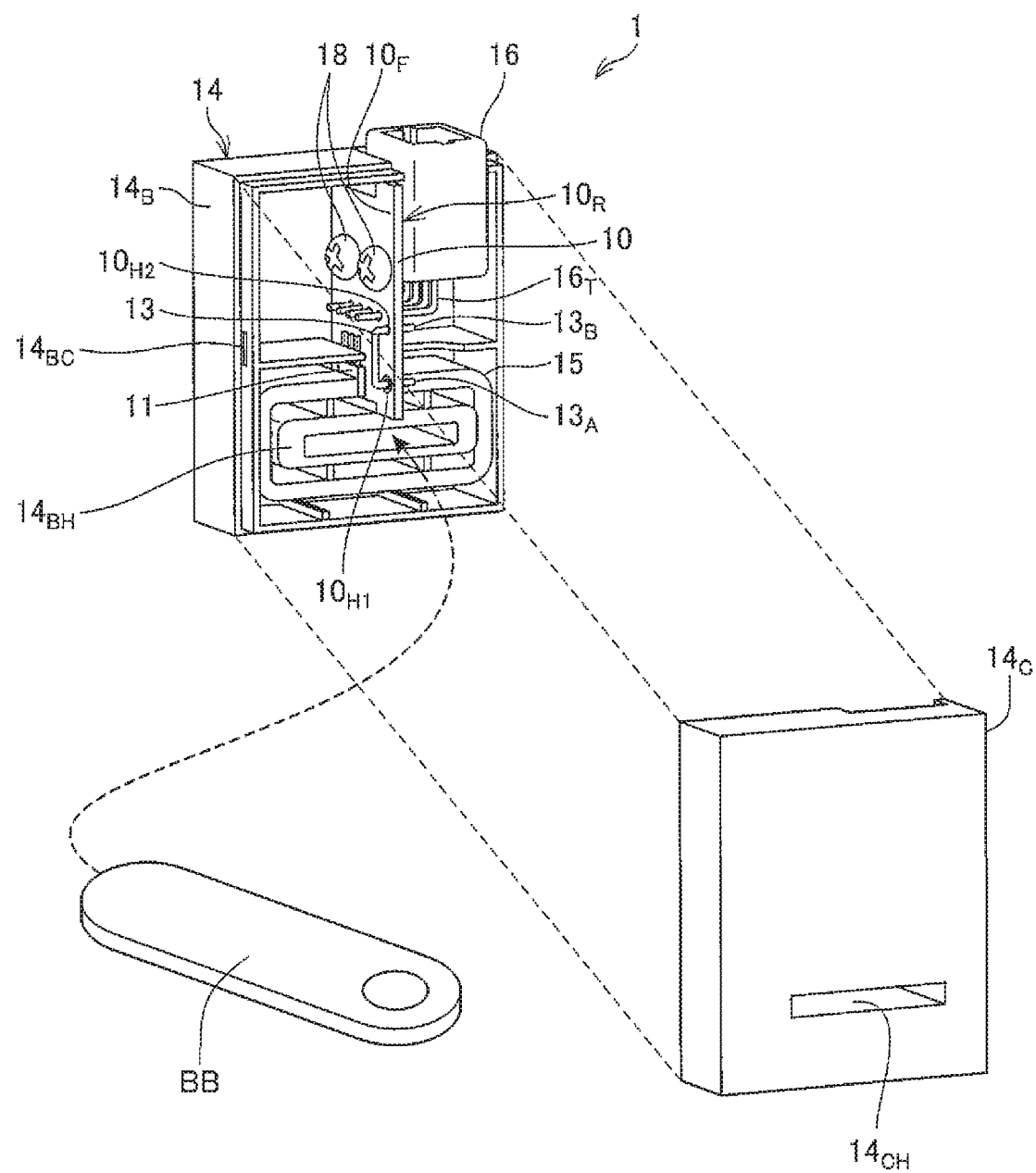
FIG. 1 is a perspective view showing a schematic configuration of a sensor intermediate part according to one embodiment of the present invention.

Hereinafter, the embodiments of the present invention will be described with reference to the drawings. The drawings are schematic or conceptual, and the dimensions of each members, the ratios of the sizes among the members and the like are not necessarily the same as the actual members. In addition, even when representing the same member or the like, there may be cases in which the dimensions and ratios of the dimensions are expressed differently in the drawings. In addition, in the drawings attached to the Specification of the present invention, to facilitate understanding, there are cases where the shapes, scale, vertical and horizontal dimensional ratios and the like are altered or exaggerated compared to the actual ones.

[Schematic Configuration of the Sensor Intermediate Part]

Figure 2:
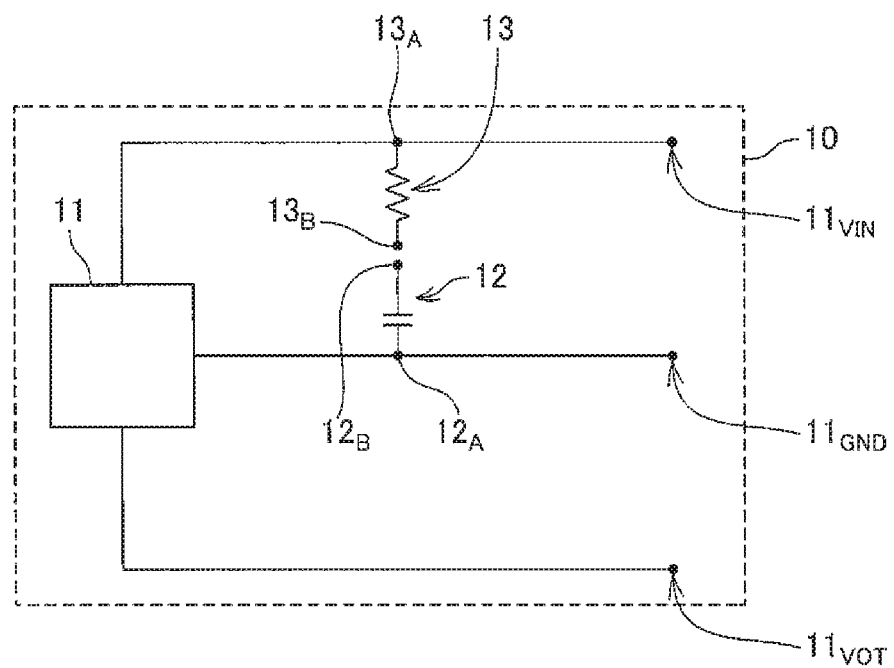
FIG. 2 is a circuit diagram schematically showing the circuit configuration of the sensor intermediate part according to the one embodiment of the present invention.
Figure 3A:
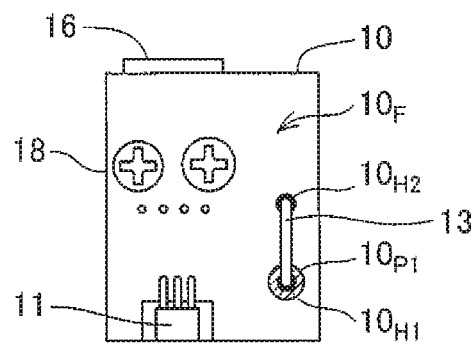
FIG. 3A is a schematic plan view showing a first surface side of a circuit board in the one embodiment of the present invention.
Figure 3B:
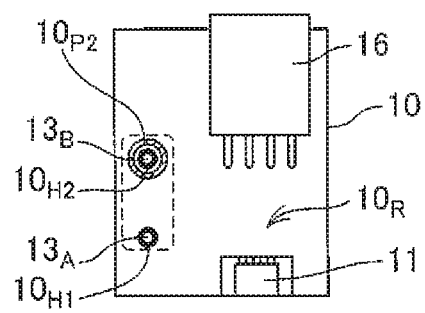
FIG. 3B is a schematic plan view showing a second surface side, which is opposite to the first surface of the circuit board shown in FIG. 3A.
Figure 3C:
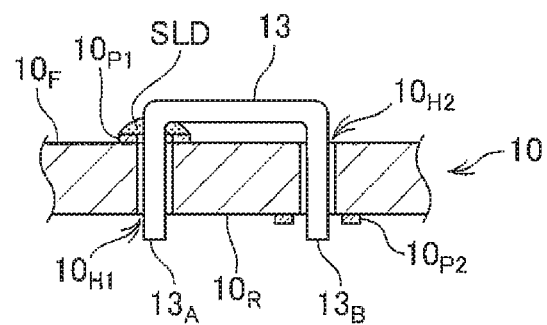
FIG. 3C is a cross-sectional view schematically showing a schematic configuration of the circuit board shown in FIG. 3A.
Figure 3D:
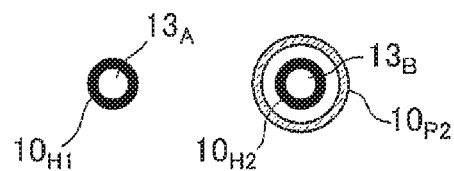
FIG. 3D is an enlarged view of the portion surrounded by a broken line of the circuit board shown in FIG. 3B.
Figure 4:
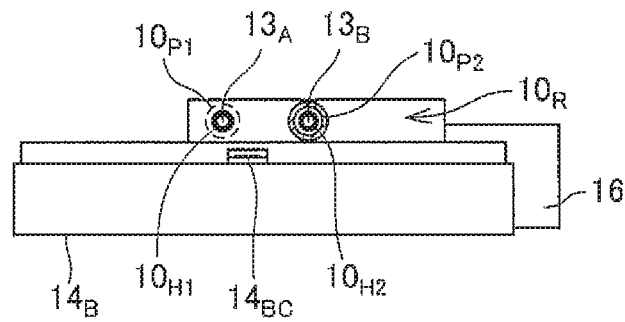
FIG. 4 is a side view of the sensor intermediate part shown in FIG. 1.

FIG. 1 is a perspective view showing a schematic configuration of a sensor intermediate part according to one embodiment of the present invention. FIG. 2 is a circuit diagram schematically showing the circuit configuration in the sensor intermediate part according to the one embodiment of the present invention. FIG. 3A is a schematic plan view showing a first surface side of a circuit board in the one embodiment of the present invention. FIG. 3B is a schematic plan view showing a second surface, which is opposite to the first surface of the circuit board shown in FIG. 3A. FIG. 3C is a cross-sectional view schematically showing a schematic configuration of the circuit board shown in FIG. 3A. FIG. 3D is an enlarged view of the portion surrounded by a broken line of the circuit board shown in FIG. 3B. FIG. 4 is a side view of the sensor intermediate part shown in FIG. 1.

As shown in FIG. 1, the sensor intermediate part according to this embodiment is an intermediate part 1 of an electric current sensor that measures the input and output electric current flowing in a bus bar BB (see dashed line area) connected to the battery, to control the input and output electric current and the like of the battery of a hybrid electric vehicle or the like, for example. The sensor intermediate part 1 is provided with a circuit board 10 on which a below-described magnetic detection element 11 and a capacitor 12 are mounted, a roughly rectangular housing 14 that holds the circuit board 10, a roughly C-shaped magnetic core 15 having a prescribed gap, and a connector 16.

The housing 14 has a first housing $14_B$ in which the circuit board 10 is housed, and a second housing $14_C$ that can cover the opening of the first housing $14_B$. In the first housing $14_B$ and the second housing $14_C$, insertion holes $14_{BH}$ and $14_{CH}$, through which a flat-plate-shaped bus bar BB is inserted, are formed to be continuous with each other in alignment. The magnetic core 15 is housed in the first housing $14_B$ to surround the insertion hole $14_{BH}$ (see FIG. 1). As shown in FIG. 1, the insertion holes $14_{BH}$ and $14_{CH}$ have hole shapes through which the bus bar BB can be inserted, corresponding to the width (length in the short direction) and thickness of the bus bar BB. The cross-sectional shape of the bus bar BB provided in the sensor intermediate part 1 in this embodiment is roughly rectangular, but this is intended to be illustrative and not limiting, and, for example, the bus bar BB may be roughly circular or the like, and the cross-sectional area of the bus bar BB is not particularly limited, either. The hole shapes of the insertion holes $14_{BH}$ and $14_{CH}$ may be appropriately set in accordance with the shape of the bus bar BB that is inserted.

The circuit board 10 has a first surface $10_F$ and a second surface $10_R$, which is opposite to the first surface $10_F$, and the magnetic detection element 11 and the capacitor 12 (not shown in FIG. 1) are arranged on the first surface $10_F$ side. The circuit board 10 is attached within the first housing $14_B$ such that the magnetic detection element 11 arranged on the first surface $10_F$ is positioned in the gap of the magnetic core 15. The connector 16 is provided on the second surface $10_B$ side of the circuit board 10 and is fixed to the circuit board 10 by screws 18.

In the circuit board 10, as described below, a first through hole $10_{H1}$ and a second through hole $10_{H2}$ are formed, and one end $13_A$ and the other end $13_B$ of a roughly U-shaped jumper wire 13 are respectively inserted into the first through hole $10_{H1}$ and the second through hole $10_{H2}$. As described below, a connector positioned on the one end $13_A$ side of the jumper wire 13 is conducted to a power source terminal $11_{VIN}$ of the magnetic detection element 11, but the connector positioned at the other end $13_B$ side is not conducted to the capacitor 12.

The magnetic detection element 11 includes a magnetic sensor such as a Hall's element or the like that outputs an output signal (output voltage) in response to a magnetic field generated by the input and output electric currents flowing in the bus bar BB, and a signal processing IC. An EEPROM or the like is housed in the signal processing IC as a memory part that stores adjustment parameters for adjusting the properties of the output signal. As the magnetic detection element 11, one in which a signal processing IC and a Hall element such as a programmable IC are integrated, or one in which an MR element (AMR element, GMR element or TMR element) and a signal processing IC are hybridized, or the like, may be used.

The sensor intermediate part 1 in this embodiment has a high-capacitance capacitor 12. "High capacitance" in this embodiment means, for example, a capacitance that, when compared to a capacitor in which the electrostatic capacitance in general is 0.1 μF or less, is larger than the capacitance of such, such as a bypass capacitor or the like positioned on the circuit board for the purpose of removing or blocking noise (that can be viewed as one type of alternating current) or the like that causes erroneous operation of ICs by causing the voltage to fluctuate by mixing into the direct current flowing in the electronic circuit. The electrostatic capacitance of the capacitor 12 in this embodiment is preferably 1 μF or more, and more preferably 1~100 μF, when it can be appropriately set in accordance with the impedance of the power source system and the fall time of the power source voltage. In addition, in an electric current sensor produced from the sensor intermediate part 1 in this embodiment, miniaturization has been required in many cases, so from the perspective of controlling mounting space in the housing 14 (on the circuit board 10), using a chip-type capacitor as the capacitor 12 is preferable.

The jumper wire 13 may be one in which a portion that conducts to the capacitor 12 on the one end $13_A$ side and a portion that conducts to the power source terminal $11_{VIN}$ of the magnetic detection element 11 on the other end $13_B$ side are exposed, and portions other than these are covered by an insulator. The jumper wire 13 may be one in which the entirety is exposed (is not covered by an insulator).

The connector 16 has a connection terminal $16_T$, and the connection terminal $16_T$ and each of the below-described terminals of the magnetic detection element 11 are connected via wiring (undepicted) on the circuit board 10. When the properties of the output signal of the magnetic detection element 11 are adjusted in the sensor intermediate part 1 in this embodiment, by connecting a programming device (not shown) to the connector 16, the magnetic detection element 11 and the programming device are connected via the connector 16, and a write signal (programming signal) for adjusting the properties of the output signal from the below-described power source terminal $11_{VIN}$ or a synchronization signal is input into the magnetic detection element 11. The connector 16 can function as the input unit for the write signal or the synchronization signal in the sensor intermediate part 1, but the connector 16 can function as the output unit for the output signal output from the magnetic detection element 11 in the electric current sensor.

[Circuit Configuration of the Sensor Intermediate Part]

The circuit configuration of the sensor intermediate part 1 in this embodiment will be described with reference to FIG. 2. The magnetic detection element 11 has a power source terminal $11_{VIN}$, a ground terminal $11_{GND}$ and an output terminal $11_{VOT}$. The capacitor 12 has a first terminal $12_A$ and a second terminal $12_B$. The jumper wire 13 has the one end $13_A$ and the other end $13_B$. As shown in FIG. 2, the first terminal $12_A$ of the capacitor 12 is conducted to the ground terminal $11_{GND}$, and the connection part positioned on the one end $13_A$ side of the jumper wire 13 is conducted to the power source terminal $11_{VIN}$, but the connection part positioned at the other end $13_B$ side of the jumper wire 13 is not conducted to the second terminal $12_B$ of the capacitor 12. That is, in the circuit of the sensor intermediate part 1, the capacitor 12 is not conducted to the power source terminal $11_{VIN}$. The sensor intermediate part 1 in this embodiment is configured so that the power source terminal $11_{VIN}$ and the second terminal $12_B$ can be electrically connected via the jumper wire 13. The circuit configuration is not limited to the one shown in FIG. 2. and the circuit configuration may be one in which the first terminal $12_A$ of the capacitor 12 is conducted to ground terminal $11_{GND}$, and the connection positioned at the other end $13_B$ side of the jumper wire 13 is conducted to the second terminal $12_B$ of the capacitor 12, but the connection part positioned at the one end $13_A$ side of the jumper wire 13 is not conducted to the power source terminal $11_{VIN}$.

In this embodiment, as noted above, the capacitor 12 is not conducted to the power source terminal $11_{VIN}$. Through this, it is possible to prevent the waveform of the write signal or the synchronization signal input from the power source terminal $11_{VIN}$ from being distorted by the effects of the capacitor 12, so it is possible to adjust the properties of the output signal output from the magnetic detection element 11 in the sensor intermediate part 1.

[Connection State of Jumper Wire]

Details of the connection state of the jumper wire 13 in this embodiment will be described with reference to FIGS. 3A~FIG. 3D. The first through hole $10_{H1}$ and the second through hole $10_{H2}$, which penetrate in the thickness direction of the circuit board, are formed in the circuit board 10 with a prescribed spacing. In addition, a first pad $10_{P1}$ conducting to the power source terminal $11_{VIN}$ is arranged at the opening periphery of the first through hole $10_{H1}$ on the first surface $10_F$ side of the circuit board 10, and a second pad $10_{P2}$ conducting to the second terminal $12_B$ is arranged at the opening periphery of the second through hole $10_{H2}$ on the second surface $10_R$ side of the circuit board 10.

The one end $13_A$ of the jumper wire 13 is inserted into the first through hole $10_{H1}$, and the connection positioned at the one end $13_A$ side of the jumper wire 13 is electrically connected by solder SLD to the first pad $10_{P1}$ on the first surface $10_F$ side of the circuit board 10 (see FIG. 3A and FIG. 3C). On the other hand, the other end $13_B$ of the jumper wire 13 is inserted into the second through hole $10_{H2}$, but the connection part positioned at the other end $13_B$ side of the jumper wire 13 is not electrically connected to the second pad $10_{P2}$ on the second surface $10_R$ side of the circuit board 10 (see FIG. 3B and FIG. 3C). The sensor intermediate part 1 in this embodiment can be configured such that the power source terminal $11_{VIN}$ and the second terminal $12_B$ can be electrically connected via the jumper wire 13. The method of electrically connecting the one end $13_A$ side of the jumper wire 13 to the first pad $10_{P1}$ is not limited to soldering, and other commonly known methods can be used.

In this embodiment, as shown in FIG. 3C and FIG. 3D, the second pad $10_{P2}$ is provided at a position separated in the radial direction from the opening periphery of the second through hole $10_{H2}$. Through this, while the other end $13_B$ of the jumper wire 13 is inserted into the second through hole $10_{H2}$, it is possible to prevent the connection part positioned at the other end $13_B$ side from short-circuiting to the second pad $10_{P2}$. The distance in the radial direction between the peripheral edge of the opening of the second through hole $10_{H2}$ and the second pad $10_{P2}$ may be set such that the connection part positioned at the other end $13_B$ side of the jumper wire 13 that has penetrated the second through hole $10_{H2}$ does not short-circuit to the second pad $10_{P2}$, and such that after adjusting the properties of the output signal of the magnetic detection element 11, the connection part positioned at the other end $13_B$ side and the second pad $10_{P2}$ can be easily connected by soldering or the like.

In addition, as shown in the side view of FIG. 4, the first through hole $10_{H1}$ and the second through hole $10_{H2}$ are formed in the circuit board 10 such that the first pad $10_{P1}$ (the first through hole $10_{H1}$) and the second pad $10_{P2}$ (the second through hole $10_{H2}$) exist at positions protruding from the opening of the first housing $14_B$ when the circuit board 10 in the present invention is housed in the first housing $14_B$. Through this, since the second pad $10_{P2}$ exists at a position protruding from the opening of the first housing $14_B$, it is possible to easily connect the other end $13_B$ of the jumper wire 13 to the second pad $10_{P2}$ at the other end by solder or the like. The above-described configuration is intended to be illustrative and not limiting. As long as the other end $13_B$ of the jumper wire 13 can be easily connected by solder or the like to the second pad $10_{P2}$, the second through hole $10_{H2}$ may be formed in the circuit board 10 to be positioned such that only the second pad $10_{P2}$ (the second through hole $10_{H2}$) protrudes from the opening of the first housing $14_B$ when the circuit board 10 is housed in the first housing $14_B$, for example. In addition, the second through hole $10_{H2}$ may be formed in the circuit board 10 such that when the circuit board 10 is housed in the first housing $14_B$, at least the second pad $10_{P2}$ (the second through hole $10_{H2}$) is positioned near the opening of the first housing $14_B$.

[Sensor]

Figure 5:
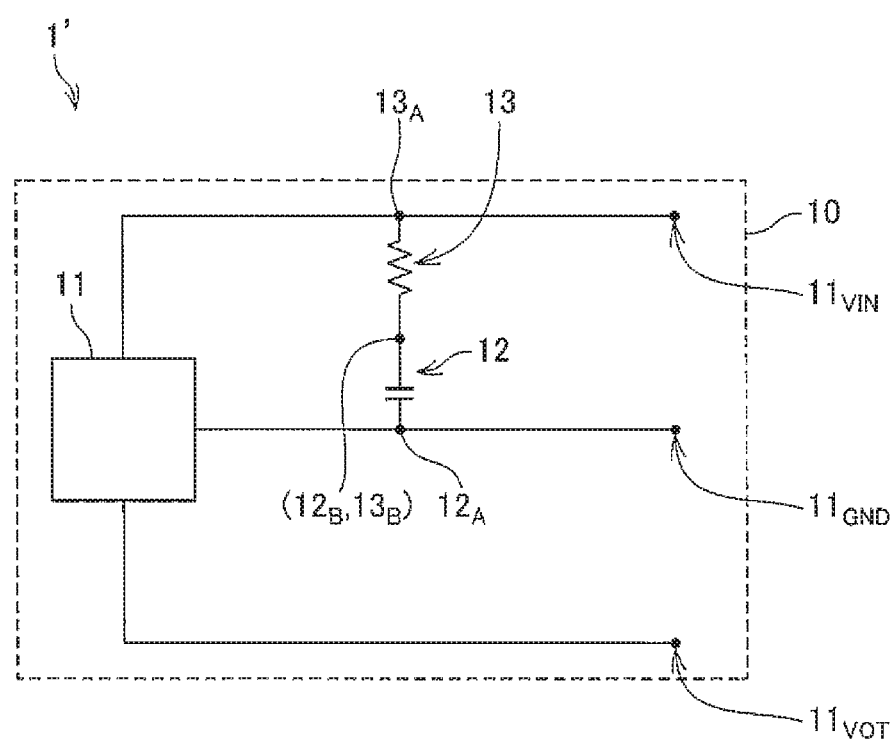
FIG. 5 is a circuit diagram schematically showing the circuit configuration of a sensor according to the first embodiment of the present invention.
Figure 6:
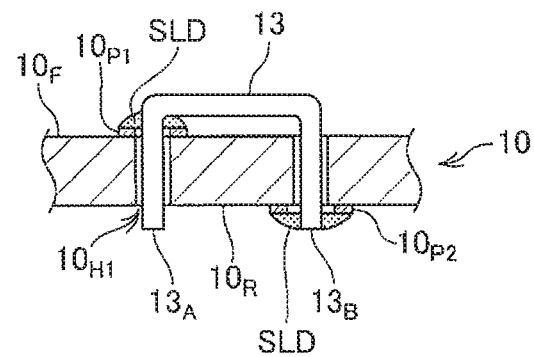
FIG. 6 is a cross-sectional view schematically showing the circuit board of the sensor according to the one embodiment of the present invention.

FIG. 5 is a circuit diagram schematically showing the circuit configuration of the sensor according to one embodiment of the present invention, and FIG. 6 is a cross-sectional view schematically showing the circuit board of the sensor according to one embodiment of the present invention. A sensor 1' according to this embodiment can be configured such that the power source terminal $11_{VIN}$ of the above-described sensor intermediate part 1 and the second terminal $12_B$ of the capacitor 12 are electrically connected by the jumper wire 13 (see FIG. 5). Specifically, while the other end $13_B$ of the jumper wire 13 is inserted into the second through hole $10_{H2}$, the connection part positioned at the other end $13_B$ side is electrically connected to the second pad $10_{P2}$ by the solder SLD, and through this, the power source terminal $11_{VIN}$ of the sensor intermediate part 1 and the second terminal $12_B$ of the capacitor 12 are electrically connected by the jumper wire 13. As described above, in the state of the sensor intermediate part 1, although the connection positioned at the first end $13_A$ side of the jumper wire 13 is conducted to the power source terminal $11_{VIN}$, the connection part positioned at the other end $13_B$ side of the jumper wire 13 is not conducted to the second terminal $12_B$ of the capacitor 12. In addition, as described below, after the properties of the output signal of the magnetic detection element 11 have been adjusted in this state, the sensor 1' in this embodiment is obtained by electrically connecting the second terminal $12_B$ of the capacitor 12 and the power source terminal $11_{VIN}$ by the jumper wire 13. Consequently, it is possible to output signals with stable properties according to the sensor 1' of this embodiment.

[Sensor Manufacturing Method]

Figure 7:
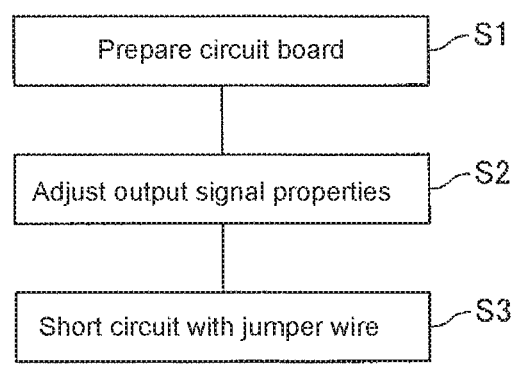
FIG. 7 is a flowchart showing the steps of the method for manufacturing the sensor according to the one embodiment of the present invention.
Figure 8A:
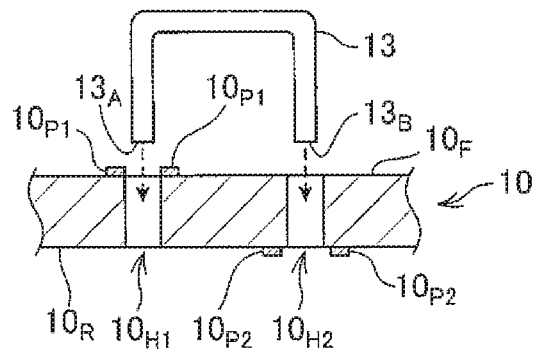
FIG. 8A is a cross-sectional end view schematically showing the state prior to a jumper wire being passed through the through holes of the circuit board, in the connection process shown in FIG. 7.
Figure 8B:
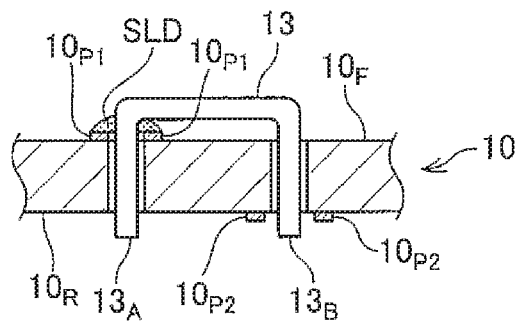
FIG. 8B is a cross-sectional end view schematically showing the state after the both ends of the jumper wire penetrate the through holes in the circuit board and one end of the jumper wire is soldered to a first surface side of the circuit board, in the connection steps shown in FIG. 7.
Figure 8C:
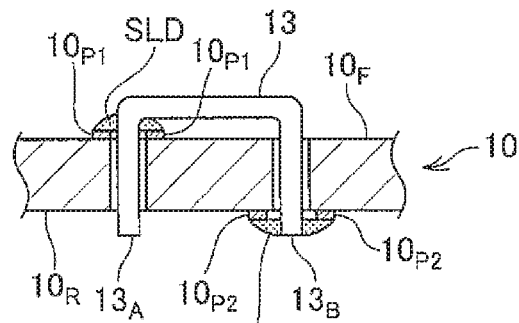
FIG. 8C is a cross-sectional end view schematically showing the state in which the other end of the jumper wire is soldered to a second surface side of the circuit board, in the connection steps shown in FIG. 7.
Figure 8D:
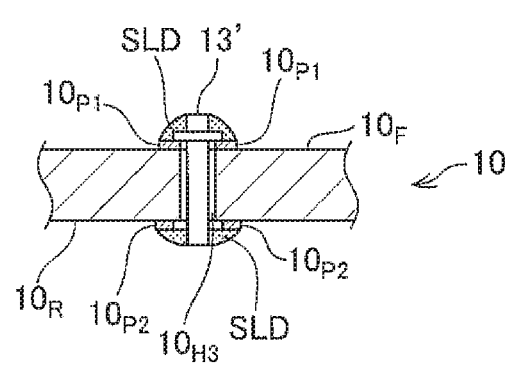
FIG. 8D is a cross-sectional end view schematically showing a connection method with a jumper wire according to another embodiment of the present invention.

FIG. 7 is a flowchart showing steps for a method of manufacturing the sensor according to one embodiment of the present invention. FIG. 8A is a cross-sectional view schematically showing the state before the ends of the jumper wire are inserted into each of the through holes of the circuit board, in the connection process shown in FIG. 7. FIG. 8B is a cross-sectional end view schematically showing the state after the two ends of the jumper wire are inserted into the through holes in the circuit board and the one side of the jumper wire is soldered to the first surface side of the circuit board, in the connection steps shown in FIG. 7. FIG. 8C is a cross-sectional end view schematically showing the state in which the other end of the jumper wire is soldered to the second surface side of the circuit board, in the connection steps shown in FIG. 7. FIG. 8D is a cross-sectional end view schematically showing a connection method by the jumper wire according to another embodiment of the present invention.

[Circuit Board Preparation Step]

First, the circuit board 10, which is configured by paper phenol, glass epoxy or the like, for example, is prepared (step S1). The magnetic detection element 11, the output signal properties of which can be adjusted, and the capacitor 12 are mounted on the first surface $10_F$ side of the circuit board 10. As described above, the magnetic detection element 11 has the power source terminal $11_{VIN}$, the ground terminal $11_{GND}$ and the output terminal $11_{VOT}$, and the capacitor 12 has the first terminal $12_A$ and the second terminal $12_B$ (see FIG. 2). The first terminal $12_A$ of the capacitor 12 is conducted to the ground terminal $11_{GND}$. The first through hole $10_{H1}$, which penetrates in the thickness direction and into which the first end $13_A$ of the roughly U-shaped jumper wire 13 can be inserted, and the second through hole $10_{H2}$, which passes through in the thickness direction and into which the other end $13_B$ can be inserted, are formed with a prescribed spacing in the circuit board 10 (see FIG. 8A). The first pad $10_{P1}$ that conducts to the power source terminal $11_{VIN}$ is provided at the periphery of the opening of the first through hole $10_F$ on the first surface $10_F$ of the circuit board 10, and the second pad $10_{P2}$ that conducts to the second terminal $12_B$ is provided at the periphery of the opening of the second through hole $10_{H2}$ on the second surface $10_R$. The second pad $10_{P2}$ is provided at a position separated in the radial direction from the opening periphery of the second through hole $10_{H2}$ on the second surface $10_R$. Through this, it is possible to prevent the connection positioned at the other end $13_B$ side from short circuiting to the second pad $10_{P2}$, while the other end $13_B$ of the jumper wire 13 has been inserted into the second through hole $10_{H2}$.

After the first end $13_A$ of the jumper wire 13 is inserted into the first through hole $10_{H1}$ and the other end $13_B$ is inserted into the second through hole $10_{H2}$, the connection part positioned at the first end $13_A$ side of the jumper wire 13 is electrically connected to the first pad $10_{P1}$ by soldering (see FIG. 8B). At this time, the connection part positioned at the other end $13_B$ side of the jumper wire 13 is not electrically connected to the second pad $10_{P2}$ (see FIG. 8B). The method of electrically connecting the connection part positioned at the first end $13_A$ side of the jumper wire 13 to the first pad $10_{P1}$ is not limited to soldering, and anther commonly known connection method can be appropriately selected.

[Adjustment Step]

Next, the properties of the output signal of the magnetic detection element 11 are adjusted by connecting the magnetic detection element 11 and the programming device (omitted from drawings) via the connector 16 (see FIG. 1), and by inputting a write signal into the magnetic detection element 11 from the power source terminal $11_{VIN}$ (step S2). The above description is intended to be illustrative and not limiting, and along with inputting a synchronization signal to the magnetic detection element 11 from the power source terminal $11_{VIN}$ via the connector 16, the properties of the output signal of the magnetic detection element 11 may be adjusted by inputting a write signal from the output terminal $11_{VOT}$. In this embodiment, the capacitor 12 and the power source terminal $11_{VIN}$ are not electrically connected at the time of adjusting the properties of the output signal, as described above, so it is possible to stably adjust the properties of the output signal without being affected by the capacitor 12.

[Connection Step]

Next, after the properties of the output signal have been adjusted, by electrically connecting the connection part positioned at the other end $13_B$ side of the jumper wire 13 and the second pad $10_{P2}$ by soldering (see FIG. 8C), the second terminal $12_B$ of the capacitor 12 and the power source terminal $11_{VIN}$ are electrically connected by the jumper wire 13 (step S3). At this time, as described above, because the second pad $10_{P2}$ (the second through hole $10_{H2}$) exists at a position close to the opening of the housing $14_B$ or protruding from this opening, work space for soldering is ensured, and the connection work can be performed easily. In addition, if the jumper wire 13 is fixed to the circuit board 10 in this connection step but not in the circuit board preparation step, it is necessary to hold both ends of the jumper wire with hands, a jig or the like after inserting the two ends of the jumper wire 13 into the through holes, and the work becomes complex. In contrast, in this embodiment, as described before, after both ends of the jumper wire 13 are inserted into the through holes in the circuit board preparation step, the connection part positioned at the one end $13_A$ side is electrically connected to the first pad $10_{P1}$ by soldering, so the jumper wire 13 is fixed to the circuit board 10 at the connection area. Hence, after the adjustment process, in this connection step, it is only necessary to electrically connect the connection part positioned at the other end $13_B$ side and the second pad $10_{P2}$ by soldering, so the connection work of the jumper wire 13 can be easily performed. With the sensor manufacturing method of this embodiment, it is possible to stably adjust the properties of the output signal of the magnetic detection element 11, without being affected by the capacitor 12. In addition, the sensor 1' manufactured by the sensor manufacturing method of this embodiment can work stably even if the output voltage instantaneously fluctuates due to noise or the like.

The above-described roughly U-shaped jumper wire 13 is intended to be illustrative and not limiting, and it would be acceptable to use a bar-shaped jumper wire 13' such as that shown in FIG. 8D, and after electrically connecting the one end side of the jumper wire 13' and the first pad $10_{P1}$ provided at the periphery of the opening of a through hole $10_{H3}$ on the first surface 10F of the circuit board 10, to adjust the properties of the output signal of the magnetic detection element 11 and then the second pad $10_{P2}$ provided at the periphery of the opening of the through hole $10_{H3}$ on the second surface $10_R$ and the other end side of the jumper wire 13 may be electrically connected by soldering. In this case, at the connection portion of the bar-shaped jumper wire 13, due to differences in the coefficients of thermal expansion between the circuit board 10 and the jumper wire 13, when the usage environment is exposed to high temperatures or low temperatures, thermal stress readily concentrates on the soldered area in the above-described connection portion. In contrast, with the above-described roughly U-shaped jumper wire 13, even if the usage environment is exposed to high temperatures, for example, and the circuit board 10 expands causing the circuit board 10 to deform in the direction of thickness as a result, the roughly U-shaped jumper wire 13 readily deforms in three dimensions (the width direction, the height direction and the depth direction) to follow the deformation of the circuit board 10. By deforming the jumper wire 13 in the desired three dimensions, the thermal stress applied to the soldered portion is relieved. As a result, concentration of thermal stress at the connection portion of the jumper wire 13 is avoided, and it possible to further improve the connection reliability (durability) of the soldered region.

With the sensor manufacturing method according to the above-described embodiment, after the properties of the output signal of the magnetic detection element 11 are adjusted, the capacitor 12 is electrically connected to the power source terminal $11_{VIN}$, so a sensor capable of outputting a signal with stable properties can be manufactured with high yield.

The above-described embodiment is presented to facilitate understand of the present invention and is not presented to limit the present invention. Accordingly, the various elements disclosed in the above-described embodiment include all design modifications and equivalents falling within the technical scope of the present invention.

In the above-described embodiment, a circuit configuration of the sensor intermediate part 1 of the electric current sensor that measures the input and output electric currents flowing in a conductor such as a bus bar BB or the like using the magnetic detection element 11 was explained as an example, and this is intended to be illustrative and not limiting. The circuit configuration of the sensor intermediate part 1 in this embodiment can be also used as a circuit configuration in an intermediate part of an angular sensor that performs detection of the rotational position of a rotating body such as a steering wheel or the like in an automobile or the like, using the magnetic detection element 11, for example. In addition, the present invention is not limited to the circuit configuration of the intermediate part 1 of an electric current sensor or the like that uses the magnetic detection element 11, and the circuit configuration of the sensor intermediate part 1 of this embodiment can also be used as the circuit configuration of a sensor that measures/determines the inclination of an object, the absence or presence and movement of an object, the distance to an object, the pressure of a fluid or the like, using a prescribed physical quantity detection element. As the physical quantity detection element used in a sensor that measures/determines the inclination of an object, an acceleration detection element of semiconductor format (an electrostatic capacitance detection format, a piezo-resistive format, a heat detection format or the like) that uses Micro Electro Mechanical System (MEMS) technology, an angular detection element such as a gyro sensor or the like, a light detection element such as a photodiode or the like, an ultrasonic wave detection element such as a piezoelectric element or the like, or various types of pressure detection elements or the like can be cited.

In addition, in this embodiment, after the output signal is adjusted, the connection positioned at the other end $13_B$ side of the jumper wire 13 is electrically connected to the second pad $10_{P2}$ provided at the periphery of the opening of the second through hole $10_{H2}$, so the capacitor 12 and the power source terminal $11_{VIN}$ of the magnetic detection element 11 are caused to conduct. On the other hand, instead of this, a method can be conceived in which, without using the jumper wire 13, after the output signal is adjusted, the capacitor 12 is mounted on the circuit board 10. However, when the capacity of the housing 14 and the mounting surface area of the circuit board 10 become relatively small to reduce the size of the sensor 1', typically a chip-type capacitor is used for convenience in mounting space. However, when mounting a relative small capacitor such as a chip-type capacitor on the circuit board 10 after the fact, mounting mistakes and the like occur, and a tiny capacitor is placed at the position where another circuit is mounted. Then, electrical defects such as short circuits in the other circuit can arise. A sensor intermediate part in which electrical defects have occurred cannot be used in a product, so yields fall. On this point, in this embodiment, in the circuit board 10 on which the capacitor 12 has been mounted in advance, after the output signal of the magnetic detection element 11 is adjusted, the capacitor 12 and the power source terminal $11_{VIN}$ of the magnetic detection element are caused to conduct by the jumper wire 13, so it is possible to prevent mounting mistakes and the like for tiny capacitors such as chip-type capacitors. As a result, it is possible to increase yields.

Figure 9:
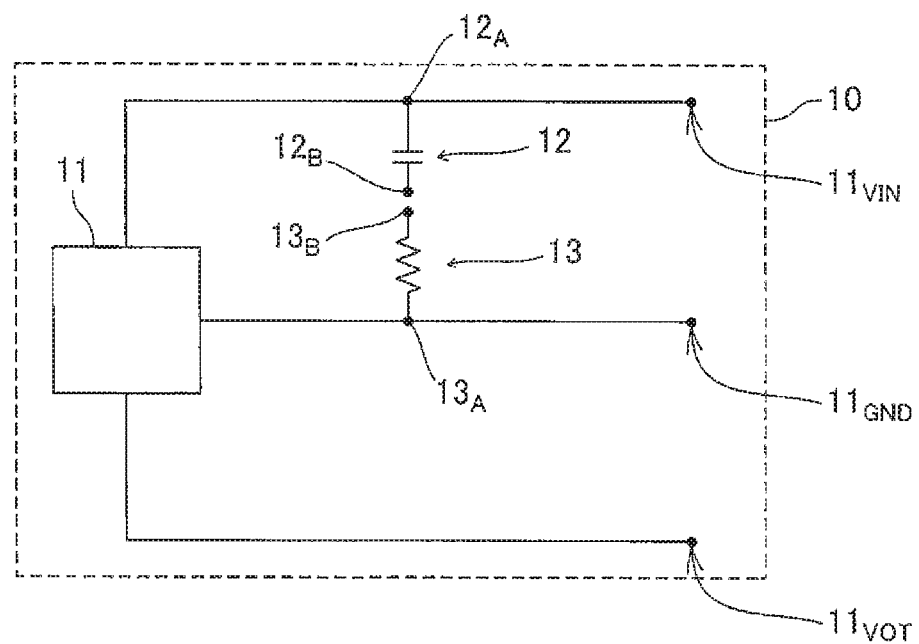
FIG. 9 is a circuit diagram schematically showing a circuit configuration of a sensor intermediate part according to another embodiment of the present invention.

In addition, the circuit configuration in the circuit board 10 of the sensor intermediate part 1 of this embodiment is not limited to the circuit configuration shown in FIG. 2 and may be a circuit configuration shown in FIG. 9. The circuit configuration shown in FIG. 9 is described below. In FIG. 9, the same reference symbols are attached to configurations that are roughly the same as in the circuit configuration shown in FIG. 2, and detailed description of such is omitted here. As shown in FIG. 9, the first terminal $12_A$ of the capacitor 12 is conducted to the power source terminal $11_{VIN}$, but the second terminal $12_B$ of the capacitor 12 is not conducted to the connection positioned at the other end $13_B$ side of the jumper wire 13, and the connection positioned at the one end $13_A$ side of the jumper wire 13 is conducted to the ground terminal $11_{GND}$. That is, in the circuit of the sensor intermediate part 1 shown in FIG. 9, the capacitor 12 is not conducted to the ground terminal $11_{GND}$. The sensor intermediate part 1 shown in FIG. 9 is configured so that the ground terminal $11_{GND}$ and the second terminal $12_B$ can be electrically connected by the jumper wire 13. The circuit configuration shown in FIG. 9 is intended to be illustrative and not limiting, and it would be fine to have a circuit configuration in which the first terminal $12_A$ of the capacitor 12 is conducted to the power source terminal $11_{VIN}$ and the second terminal $12_B$ of the capacitor 12 is conducted to the connection part positioned at the other end $13_B$ side of the jumper wire 13, but the connection part positioned at the one end $13_A$ side of the jumper wire 13 is not conducted to the ground terminal $11_{GND}$.

In the circuit configuration shown in FIG. 9, the capacitor 12 is not conducted to the ground terminal 11, as described above. Through this, it is possible to prevent the waveform of the write signal or synchronization signal input from the power source terminal $11_{VIN}$ from being deformed by the effects of the capacitor 12, so it is possible to adjust the properties of the output signal output from the magnetic detection element 11 in the sensor intermediate part 1.

In the circuit board 10 having the circuit configuration shown in FIG. 9 (see FIG. 3A~FIG. 3D), the first pad $10_{P1}$ may be conducted to the ground terminal $11_{GND}$ of the magnetic detection element 11. In this circuit board 10, the one end $13_A$ of the jumper wire 13 is inserted into the first through hole $10_{H1}$, and the connection part positioned at the first end $13_A$ side is electrically connected to the first pad $10_{P1}$ by the solder SLD. On the other hand, the other end $13_B$ of the jumper wire 13 is inserted into the second through hole $10_{H2}$, but the connection part positioned at the other end $13_B$ side is not electrically connected to the second pad $10_{P2}$. In this manner, in the circuit board 10 of the sensor intermediate part 1 having the circuit configuration shown in FIG. 9, the ground terminal $11_{GND}$ of the magnetic detection element 11 and the second terminal $12_B$ of the capacitor 12 can be configured to be electrically connectable via the jumper wire 13.

DESCRIPTION OF REFERENCE SYMBOLS

1 Sensor intermediate part
10 Circuit board
$10_F$ First surface
$10_R$ Second surface
$10_{H1}$ First through hole
$10_{H2}$ Second through hole
$10_{P1}$ First pad
$10_{P2}$ Second pad
11 Magnetic detection element
$11_{VIN}$ Power source terminal
$11_{GND}$ Ground terminal
$11_{VOT}$ Output terminal
12 Capacitor
$12_A$ First terminal
$12_B$ Second terminal
13 Jumper wire
$13_A$ One end
$13_B$ Other end
14 Housing
$14_B$ First housing
$14_C$ Second housing

The invention claimed is:

1. A sensor intermediate part comprising:
a physical quantity detection element that has a power source terminal, a ground terminal and an output terminal, which outputs a desired output signal, wherein the physical quantity detection element is capable of adjusting properties of the output signal;
a high-capacitance capacitor having at least a first terminal and a second terminal; and
a jumper wire, one end of which is conducted to one of the power source terminal and the second terminal and the other end of which is not conducted to the other of the power source terminal and the second terminal;
wherein the first terminal is conducted to the ground terminal; and
the power source terminal and the second terminal are configured to be electrically connectable by the jumper wire.

2. The sensor intermediate part according to claim 1, further comprising:
a circuit board having a first surface and a second surface, which is opposite to the first surface, wherein the physical quantity detection element and the capacitor are arranged on the first surface of the circuit board;
a first through hole and a second through hole, which penetrate in the thickness direction of the circuit board and which are formed with a prescribed spacing in the circuit board; and
a first pad, which can be conducted to one of the power source terminal and the second terminal, arranged at the periphery of the opening of the first through hole on the first surface, and a second pad, which can be conducted to the other of the power source terminal and the second terminal, arranged at the periphery of the opening of the second through hole on the second surface;
wherein one end of the jumper wire, which is roughly U-shaped, is inserted into the first through hole and the one end of the jumper wire is electrically connected to the first pad on the first surface side; and
the other end of the jumper wire is inserted into the second through hole and the other end of the jumper wire is not electrically connected to the second pad on the second surface.

3. The sensor intermediate part according to claim 2, wherein the second pad is provided at a position separated in the radial direction from the opening periphery of the second through hole on the second surface.

4. The sensor intermediate part according to claim 2, further comprising a housing that holds the circuit board;
wherein the housing includes a first housing and a second housing that covers an opening of the first housing; and
the second through hole is formed in the circuit board such that at least the second pad exists at a position close to the opening of the first housing or protruding from the opening when the circuit board is held in the first housing.

5. The sensor intermediate part according to claim 1, wherein the capacitor has a capacitance of 1 μF or more.

6. A sensor, wherein the power source terminal and the second terminal of the sensor intermediate part according to claim 1 are electrically connected by the jumper wire.

7. A sensor manufacturing method, including:
a preparation step wherein a circuit board is prepared on which are mounted
a physical quantity detection element, which has a power source terminal, a ground terminal, an output terminal, which outputs a desired output signal, wherein properties of the output signal are adjustable, and
a capacitor having at least a first terminal and a second terminal,
one end of a jumper wire is conducted to one of the power source terminal and the second terminal, and the other end of the jumper wire is not conducted to the other of the power source terminal and the second terminal, and the ground terminal and the first terminal are conducted;
an adjustment step wherein properties of the output signal are adjusted; and
a connection step wherein after the properties of the output signal have been adjusted, the other of the power source terminal and the second terminal are conducted to the other end of the jumper wire, so the second terminal and the power source terminal are electrically connected by the jumper wire.

8. The sensor manufacturing method according to claim 7, wherein:
the circuit board has a first surface and a second surface, which is opposite to the first surface;

a first through hole and a second through hole, which penetrate in the thickness direction, are formed with a prescribed spacing in the circuit board;

a first pad conducting to one of the power source terminal and the second terminal is provided at the periphery of the opening of the first through hole on the first surface, and a second pad conducting to the other is provided at the periphery of the opening of the second through hole on the second surface;

one end of the jumper wire, which roughly U-shaped, is inserted into the first through hole, and the first pad and the one end side of the jumper wire are electrically connected; and the other end of the jumper wire is inserted into the second through hole, and the second pad and the other end side of the jumper wire are not electrically connected.

9. The sensor manufacturing method according to claim 8, wherein in the connection step, the second pad and the other end side of the jumper wire are electrically connected.

10. The sensor manufacturing method according to claim 8, wherein the second pad is provided at a position separated in the radial direction from the opening periphery of the second through hole on the second surface.

11. A sensor intermediate part comprising:

a physical quantity detection element that has a power source terminal, a ground terminal and an output terminal, which outputs a desired output signal, wherein the physical quantity detection element is capable of adjusting properties of the output signal;

a high-capacitance capacitor, which has at least a first terminal and a second terminal; and a jumper wire, one end of which is conducted to one of the ground terminal and the second terminal and the other end of which is not conducted to the other of the ground terminal and the second terminal;

wherein the first terminal is conducted to the power source terminal; and the ground terminal and the second terminal are configured to be electrically connectable by the jumper wire.

* * * * *